(12) United States Patent
Wu (10) Patent No.: US 6,711,360 B1
(45) Date of Patent: Mar. 23, 2004

(54) DUTY-CYCLE ADJUSTABLE CLOCK GENERATOR WITH LOW REVERSE BIAS AND ZERO DC LEVEL

(75) Inventor: Shihchang Wu, Rancho Palos Verdes, CA (US)

(73) Assignee: Remec, Inc,, Del Mar, CA (US)

( * ) Notice: Subject to any disclaimer, the term of this patent is extended or adjusted under 35 U.S.C. 154(b) by 222 days.

(21) Appl. No.: 10/035,388

(22) Filed: Dec. 28, 2001

(51) Int. Cl.[7] .......................... H04B 10/04; H03K 3/17; H03K 3/00
(52) U.S. Cl. ........................ 398/182; 398/183; 327/175; 327/291
(58) Field of Search ................................. 398/182, 183; 327/291, 293, 294, 175; 375/373

(56) References Cited

U.S. PATENT DOCUMENTS

| | | | | |
|---|---|---|---|---|
| 3,660,766 | A | * 5/1972 | Hilliard, Jr. | 327/105 |
| 4,831,343 | A | * 5/1989 | Baron | 331/116 R |
| 5,550,499 | A | 8/1996 | Eitrheim | 327/175 |
| 5,963,071 | A | 10/1999 | Dowlatabadi | 327/175 |
| 6,157,226 | A | * 12/2000 | Ishimi | 327/116 |
| 6,253,066 | B1 | 6/2001 | Wilhite et al. | 455/108 |
| 6,294,938 | B1 | * 9/2001 | Coddington et al. | 327/158 |
| 6,384,657 | B1 | * 5/2002 | Dobos | 327/294 |

OTHER PUBLICATIONS

PCT International Search Report dated Mar. 14, 2003.
Royset et al., "Combatting Nonlinear Distortion in Optical Fibre Transmission Systems By Optimum Dispersion Compensation and Modulation Format," *Journal of Nonlinear Optical Physics& Materials*, vol. 9, No. 2 (2000), pp. 227–234.
Mikkelsen et al., "Enabling Technologies for 40 Gb/s Long Haul DWDM Transport," published by the Mintera Corporation, 2001.

* cited by examiner

*Primary Examiner*—Jason Chan
*Assistant Examiner*—Dalzid Singh
(74) *Attorney, Agent, or Firm*—Jenkens & Gilchrist (57) ABSTRACT

A duty-cycle adjustable clock generator is disclosed. Combining a fundamental sinusoidal waveform with its phase-locked second harmonic waveform generates the duty-cycle adjustable clock waveform. The clock generator maintains zero DC level and minimum reverse bias voltage swing at high microwave and millimeter wave frequencies. Proper phase shift between the fundamental and second harmonic waveforms produces the desired clock waveform. The duty-cycle is controlled by the magnitude ratio of the fundamental and phase-locked second harmonic waveforms. Due to the resulting zero DC level and minimum reverse bias voltage over the duty-cycle adjustable range, the duty-cycle adjustable clock generator can be effectively used in various microwave and optical communication systems.

30 Claims, 9 Drawing Sheets

DUTY-CYCLE ADJUSTABLE CLOCK GENERATOR WITH LOW REVERSE BIAS AND ZERO DC LEVEL

BACKGROUND OF THE INVENTION

1. Field of the Invention

The present invention relates generally to clock generators, and specifically to duty-cycle adjustable high frequency clock generators.

2. Description of Related Art

Sinusoidal waveforms have traditionally been used in the clock line to control microwave devices in various microwave systems. Sinusoidal waveforms have also traditionally been used in high-data-rate optical communication applications, such as SERDES clocks and Non-Return-to-Zero (NRZ) to Return-to-Zero (RZ) signal conversion devices that can extend the transmission distance in fiber optical communication systems.

Adjustable duty cycle is one of the key features in clock circuitry in order to tune and yield the optimum system performance. As is understood in the art, the duty cycle of a signal is the percentage of time the signal is above or below a certain threshold. A duty-cycle adjustable signal at low RF frequency (i.e., below 15 MHz) can easily be accomplished using a rectangular-pulse clock signal that includes multiple (i.e., five or more) frequency harmonics. For low frequency applications, the rectangular-pulse clock has served as the basis for most commercial waveform generators.

Figure 1:
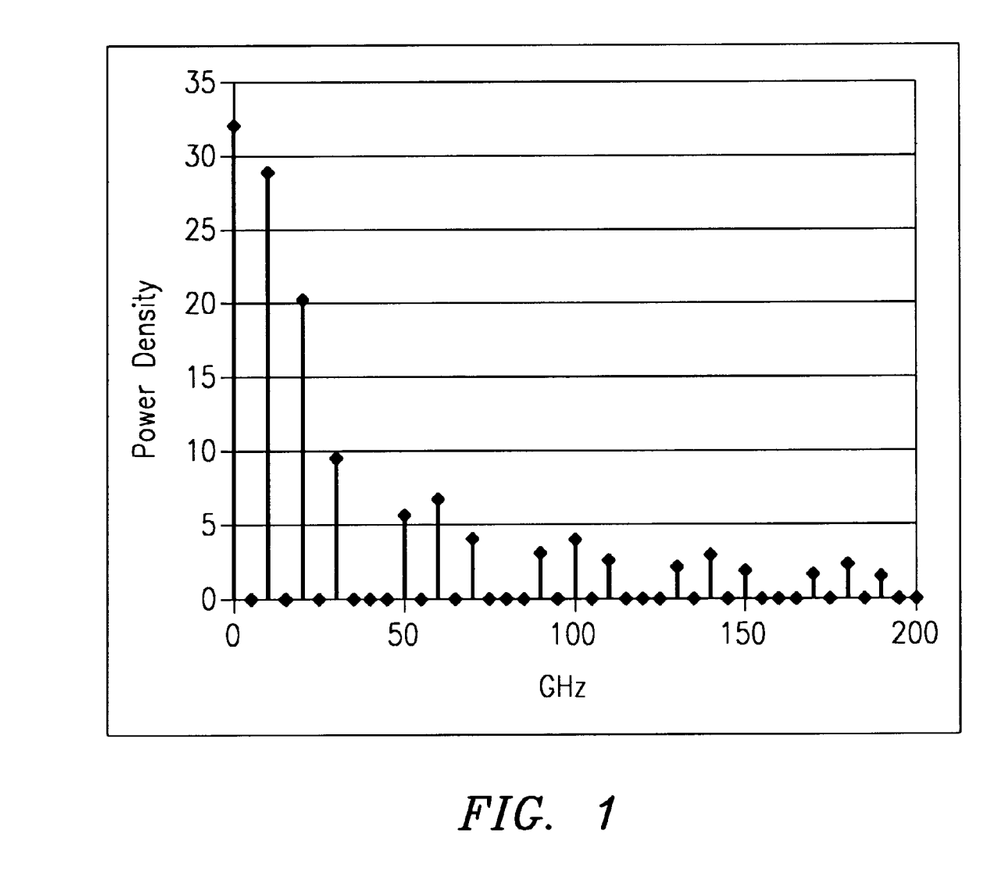
FIG. 1 is a power spectrum of 10 GHz rectangular pulses with 25% duty cycle.
Figure 2:
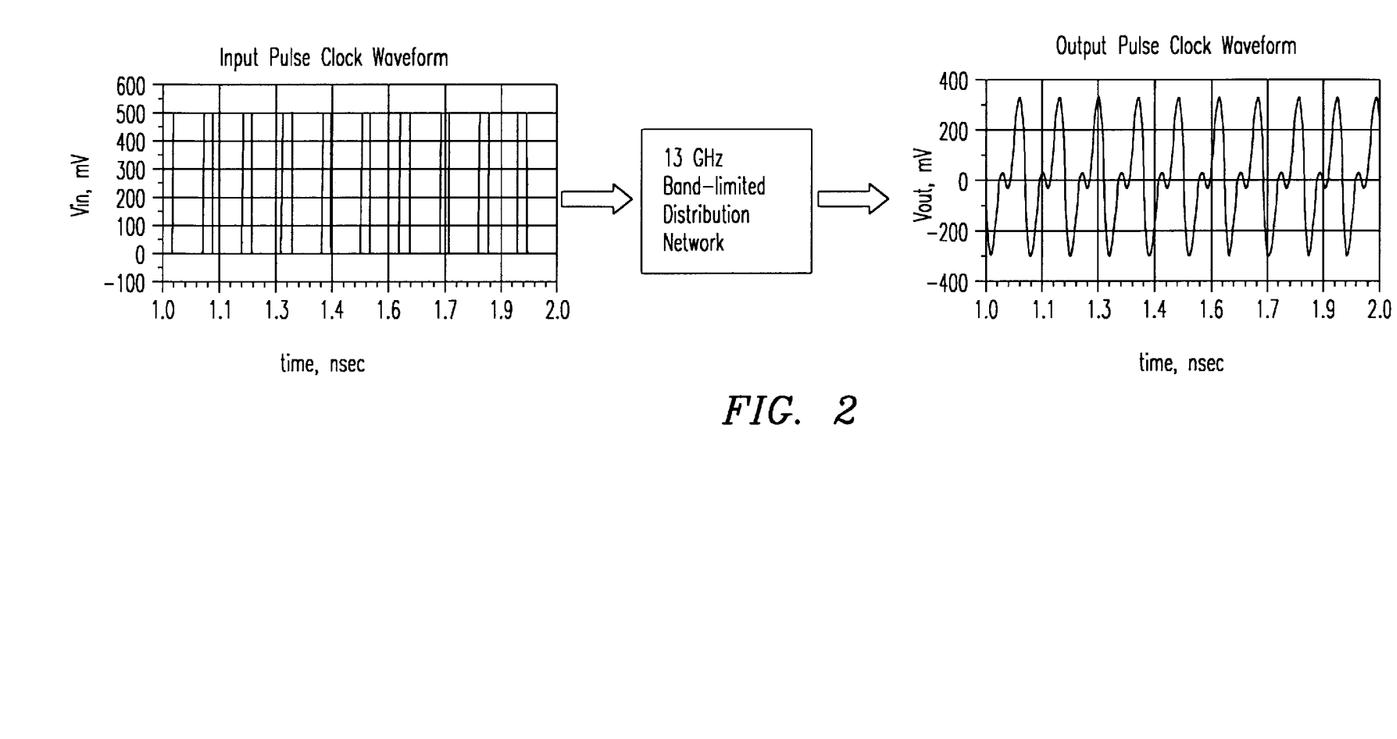
FIG. 2 is the input and output waveforms of 10 GHz rectangular pulses passed through a 13-GHz band-limited distribution network.

However, the bandwidth that is required to generate and distribute a rectangular-pulse clock increases proportionally as the clock frequency increases. For example, FIG. 1 shows the frequency spectrum of a 10 GHz rectangular-pulse clock with 25% duty cycle. When the rectangular-pulse clock signal of FIG. 1 passes through band-limited amplifiers and a clock distribution network, the waveform of the rectangular-pulse clock signal becomes distorted, as shown in FIG. 2. FIG. 2 illustrates the distortion resulting from 10 GHz pulses passing through a 13-GHz band-limited distribution network. As a result, such rectangular-pulse clock signals cannot be used in high frequency (i.e., microwave and higher) applications.

Figure 3:
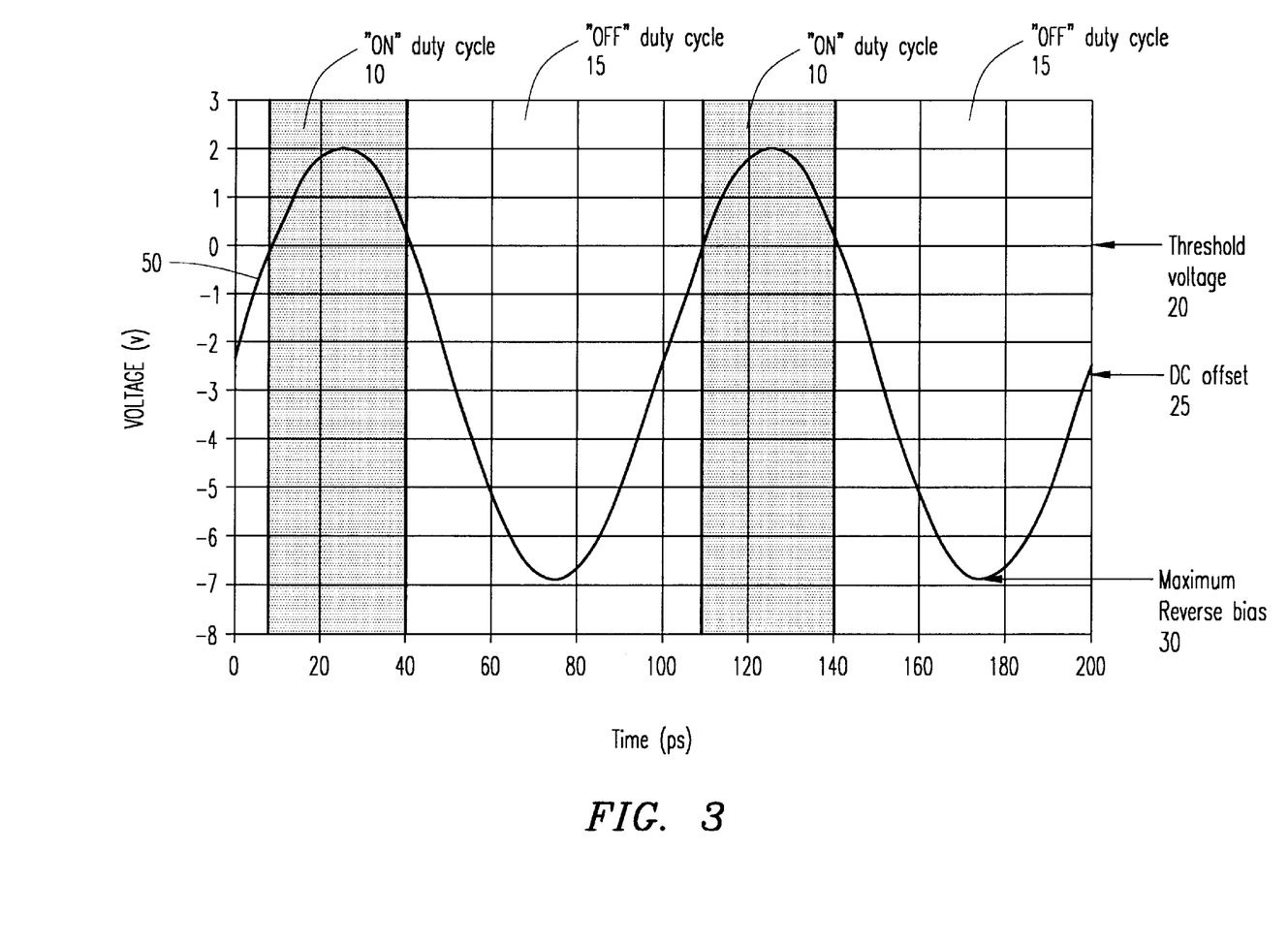
FIG. 3 is a 10 GHz level-shifted sinusoidal waveform.

Therefore, many applications have begun using a level-shifted sinusoidal waveform clock signal when the clock frequency is in the microwave range or higher. An example of a level-shifted sinusoidal waveform with 25% duty cycle and zero threshold voltage 20 is illustrated in FIG. 3. As can be seen in FIG. 3, the level-shifted sinusoidal waveform 50 is above zero volts, and therefore produces an "ON" state 10 (illustrated by shaded areas) at the device-under-control (DUC), 25% of the time and below zero volts, and therefore produces an "OFF" state 15 (illustrated by non-shaded areas) at the DUC, 75% of the time. Therefore, the duty-cycle of the level-shifted sinusoidal waveform 50 shown in FIG. 3 is 25%.

Although using only a single sine wave as the clock signal removes the problem of distortion resulting from rectangular-pulse clock signals that include multiple frequency harmonics, several concerns are associated with the use of such level-shifted sinusoidal waveforms. First, there is a significant negative DC offset voltage produced by the level-shifted sinusoidal waveform. As can be seen from FIG. 3, the level-shifted sinusoidal waveform 50 has a DC offset voltage 25 of −2.43 V. To accommodate the DC offset voltage 25 produced by the level-shifted sinusoidal waveform 50, DC coupled methods must be implemented on the distribution network (not shown), as well as at the input of the DUC (not shown). Further, when the duty-cycle changes, the DC level on the clock also changes, resulting in a drifting of the DC bias point on the DUC. Therefore, the DUC must also be designed to accommodate for the DC drifting effect, which can lead to a complicated and expensive circuit design for the DUC.

Secondly, the high negative voltage swing on the level-shifted sinusoidal clock signal results in a high transient reverse bias on the control port of the DUC. For example, as can be seen in FIG. 3, the reverse bias 30 of the level-shifted sinusoidal waveform 50 is approximately −6.9 V. The transient reverse bias condition limits the application of the level-shifted sinusoidal clock to situations where the maximum reverse bias rating of the semiconductor device(s) at the control port of the DUC is greater than the reverse bias of the signal. As is understood in the art, exceeding the maximum reverse bias rating of a semiconductor device results in permanent damage to the device. For example, the maximum reverse bias rating of a microwave Schottky diode is less than −5V. If a microwave Schottky diode, or other similar device, is present at the control port of the DUC, the level-shifted sinusoidal waveform 50 of the type shown in FIG. 3 cannot be used as the clock signal.

Third, the DC current produced by a level-shifted sinusoidal clock further limits the applications of the level-shifted sinusoidal clock signal to situations where the DC current produced by the level-shifted sinusoidal clock signal is able to be handled by the semiconductor device(s) at the control port of the DUC. As is understood in the art, to increase the cutoff frequency of a diode switch, the geometry of diode is reduced as the operating frequency increases. As a result, the higher the operating frequency, the lower the DC current handling capability. For example, if the DC current rating of a switch diode that is capable of operating at 40 GHz is approximately 2.5 mA, and there is approximately −2 V DC on the clock line, the diode must have an 800-ohm average resistance or higher to be operated safely. However, an 800-ohm resistance is too high for use with a microwave switch. Therefore, the applications of level-shifted sinusoidal clock signal are limited by the large DC current produced by the level-shifted sinusoidal waveform.

Finally, a level-shifted sinusoidal waveform typically requires a large AC voltage swing. As shown in FIG. 3, the voltage swing of the level-shifted sinusoidal waveform 50 is approximately 8.86 Vpp. This large voltage swing translates into a large RF driver amplifier output power requirement and higher dissipated power. Therefore, what is needed is an adjustable duty cycle clock generator with low reverse bias and a zero DC level.

SUMMARY OF THE INVENTION

An adjustable duty-cycle clock generator that produces a clock signal with low reverse bias and zero DC level is achieved by power combining two sinusoidal waveforms with proper phase shift and magnitude control. The clock generator includes a fundamental sinusoidal waveform source, a second harmonic waveform source, a power combiner and phase shift and magnitude control devices. The duty-cycle adjustment is achieved by varying the magnitude ratio between the fundamental and the second harmonic waveforms.

Advantageously, the resulting clock signal has duty-cycle adjustable capability, zero DC level, a low reverse bias condition and a low RF requirement. As a result, the clock signal can be used effectively in various high frequency microwave/millimeter wave systems, as well as in high-data-rate optical communication systems. In addition, because the final waveform is a linear combination of two frequency components, the magnitude control and phase shift devices can further be used as pre-distortion devices to compensate for the frequency-response difference (i.e., phase variation) of the two frequency components through the clock distribution network. Using electronic and/or mechanical control devices for magnitude and phase control allows tuning at a system integration level to yield the optimum system operation point.

BRIEF DESCRIPTION OF THE DRAWINGS

The disclosed invention will be described with reference to the accompanying drawings, which show important sample embodiments of the invention and which are incorporated in the specification hereof by reference, wherein.

DETAILED DESCRIPTION OF THE EXEMPLARY EMBODIMENTS

The numerous innovative teachings of the present application will be described with particular reference to the exemplary embodiments. However, it should be understood that these embodiments provide only a few examples of the many advantageous uses of the innovative teachings herein. In general, statements made in the specification of the present application do not necessarily delimit any of the various claimed inventions. Moreover, some statements may apply to some inventive features, but not to others.

Figure 4:
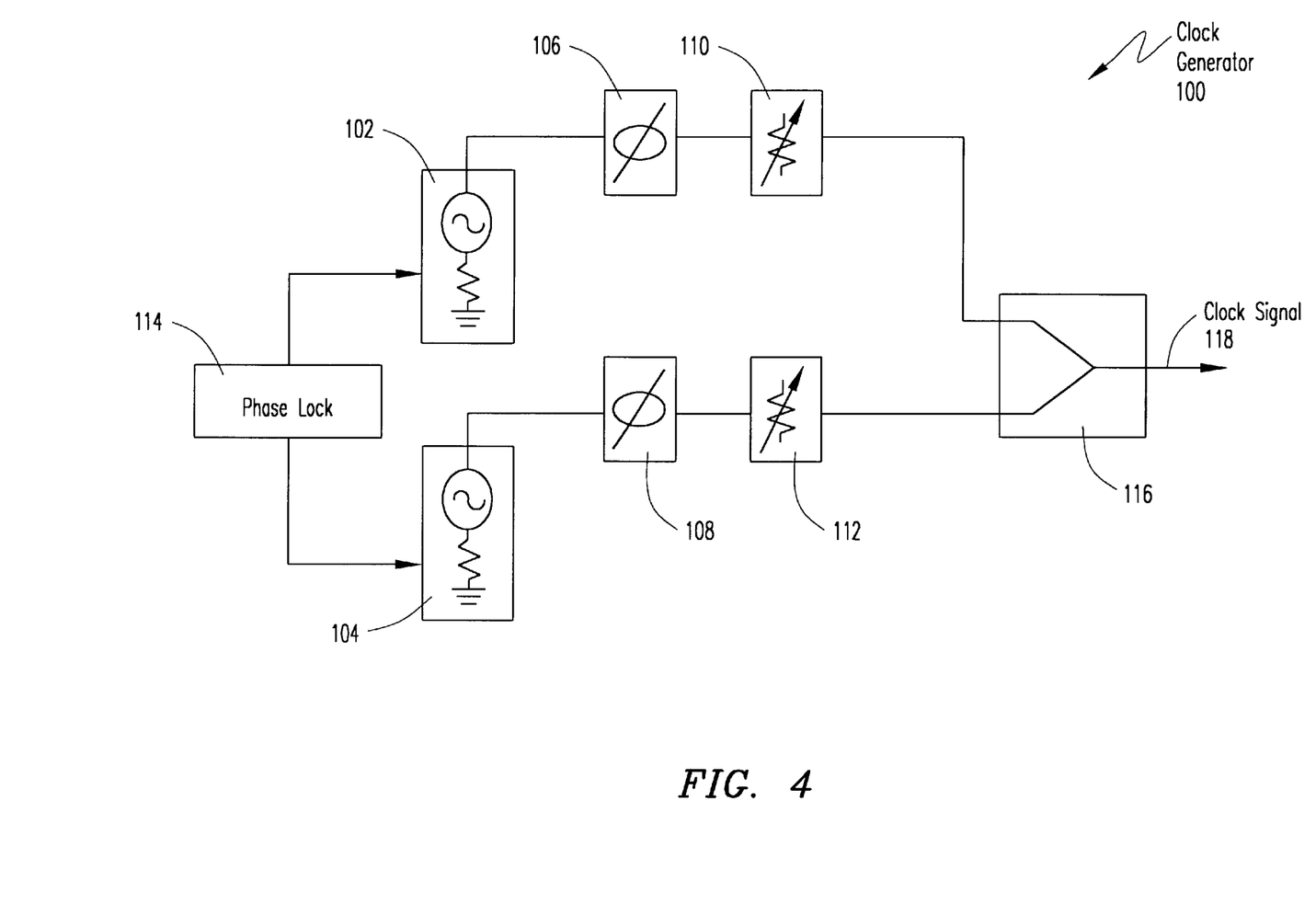
FIG. 4 is a block diagram of a duty-cycle adjustable clock generator in accordance with embodiments of the present invention.

FIG. 4 illustrates an exemplary duty-cycle adjustable clock generator 100 of the present invention. The clock generator 100 includes a fundamental sinusoidal waveform generator 102 and a phase-locked second harmonic sinusoidal waveform generator 104. The fundamental and second harmonic waveforms (e.g., 10 GHz and 20 GHz) can be generated by separate sources 102 and 104 with common phase lock 114. Alternatively, the fundamental and second harmonic waveforms can be generated from one source (e.g., waveform generator 102) to produce the fundamental waveform, then multiplied to generate the second harmonic waveform. As a further alternative, the fundamental and second harmonic waveforms can be generated from one source (e.g., waveform generator 102) with two harmonics. In implementation, the fundamental 102 and phase-locked second harmonic 104 waveform generators can be realized, for example, by two microwave oscillators that are phase-locked to the same external reference signal, by a microwave oscillator followed by a frequency multiplier or by proper filtering after a comb-frequency generator. However, it should be understood that the waveform generators 102 and 104 can be realized by any other device(s) that produce the same result.

The fundamental waveform generator 102 and phase-locked second harmonic waveform generator 104 are followed by respective phase shifters 106 and 108 and magnitude control devices 110 and 112. The clock generator 100 further includes a broadband power combiner 116 that combines the fundamental and second harmonic waveforms to produce a clock signal 118.

The phase shifters 106 and 108 can each be a fixed value (implemented as a fixed length transmission line), electrical tunable device (e.g., a GaAs phase shift monolithic microwave integrated circuit (MMIC)) or mechanical tunable device. The proper phase shift is determined based on the total phase difference between the two waveform generators, the total delta path length after the phase shifters and the 90° phase shift that is typically required on the second harmonic waveform at a device-under-control (DUC) (not shown). The magnitude control devices 110 and 112 can each be a fixed value attenuator (e.g., a microwave attenuator pad), fixed gain amplifier, electrically tunable device (e.g., a GaAs controllable attenuator MMIC, a variable gain amplifier, etc.) or a mechanical tunable device. The phase shift 106 and 108 and magnitude control 110 and 112 devices can be implemented by a single device, multiple devices or as part of the waveform generators 102 and 104. In addition, the magnitude 110 and 112 and phase control 106 and 108 devices can be implemented on both arms, as shown in FIG. 4, or can be implemented on one arm only.

The magnitude control devices 110 and 112 adjust the effective magnitude ratio of the fundamental and the second harmonic waveforms to yield the proper duty cycle. In addition, the phase shift devices 106 and 108 and magnitude devices 110 and 112 can also be used as pre-distortion circuits to compensate for the frequency response deviations (i.e., phase and magnitude changes) of the fundamental and second harmonic waveforms through the clock distribution network (not shown). For example, the effective phase shift between a 10 GHz signal and a 20 GHz signal is approximately 90 degrees. As the two signals (10 GHz and 20 GHz) travel through the clock distribution network, each signal may experience a different phase variation (e.g., the 10 GHz signal may experience a 10 degree phase change, while the 20 GHz signal may experience a 15 degree phase change). Therefore, the phase shift devices 106 and 108 can not only compensate for the expected 90 degree phase shift, but also for the effective 10 and 15 degree phase shifts, respectively, that the waveform is expected to experience through the clock distribution network. Likewise, each signal (e.g., 10 GHz and 20 GHz) may experience a different loss (e.g., the 10 GHz signal may experience a 2 dBm loss, while the 20 GHz signal may experience a 5 dBm loss) through the clock distribution network. Therefore, the magnitude control devices 110 and 112 can compensate for the losses expected to be experienced by the signals through the clock distribution network. By compensating for the distortion and loss inherent in the clock distribution network at the clock generator 100, the fundamental and second harmonic waveforms present in the clock signal can arrive with minimal loss and in-phase at the device-under-control (DUC) (not shown).

Figure 5:
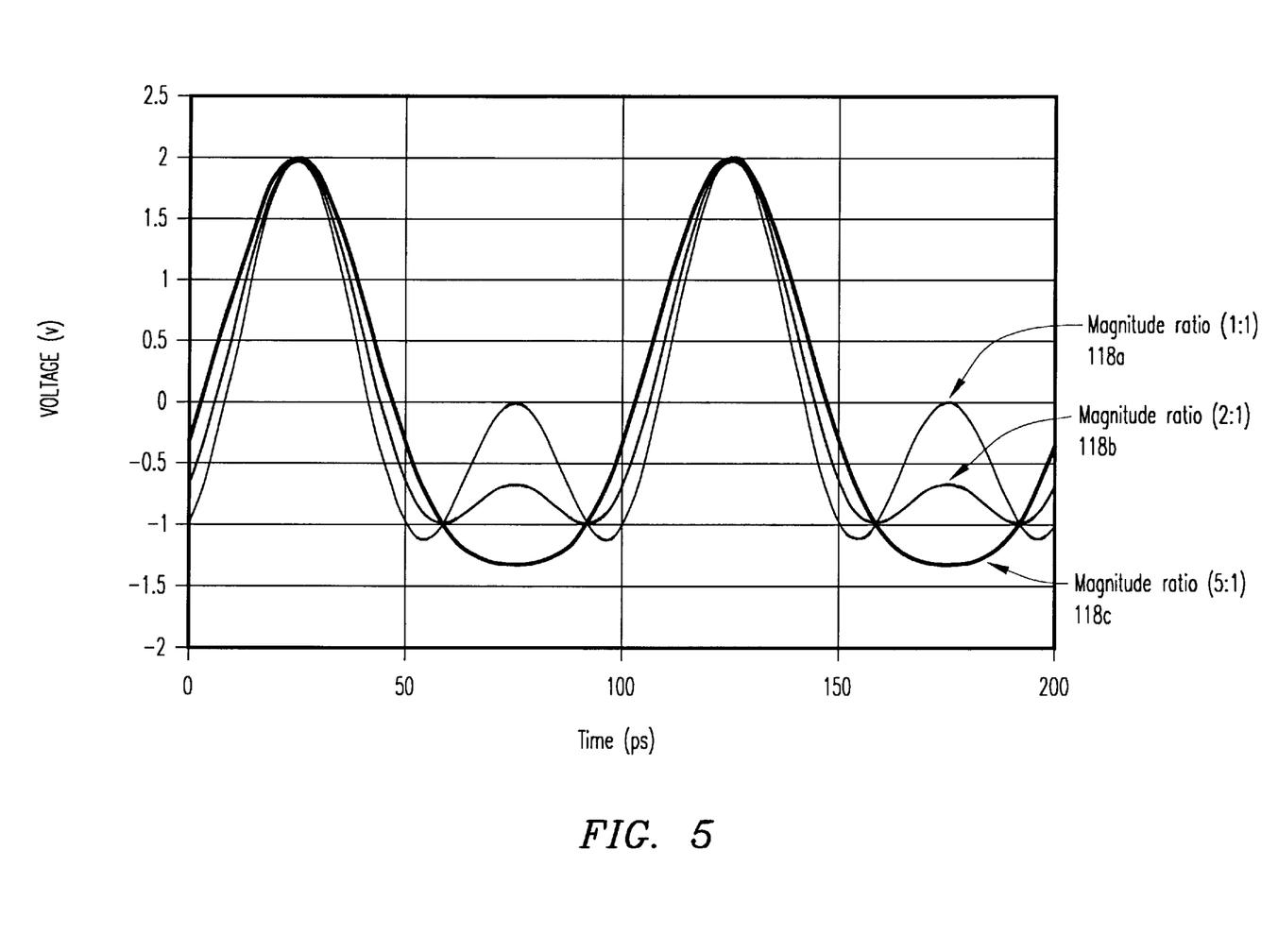
FIG. 5 is a graph illustrating exemplary output waveforms with various duty cycles of the duty-cycle adjustable clock generator shown in FIG. 4.

FIG. 5 is graph demonstrating three different duty-cycle output waveforms 118*a–c* produced by the clock generator of FIG. 4. The three different duty-cycles are obtained by varying the magnitude ratio of the fundamental and second harmonic waveforms. For example, waveform 118*a* has a fundamental to second harmonic magnitude ratio of 1:1 (both waveforms have equal magnitude), waveform 118*b* has a fundamental to second harmonic magnitude ratio of 2:1 and waveform 118*c* has a fundamental to second harmonic magnitude ratio of 5:1. The duty-cycle of waveform 118*a* is lower than the duty-cycle of waveform 118*b*, which in turn, is lower than the duty-cycle of waveform 118*c*. By combining only two sinusoidal waveforms, there is no problem with distortion resulting from a band-limited distribution network.

As can be seen in FIG. 5, each of the waveforms 118*a–c* has a low negative voltage swing, resulting in a low transient reverse bias on the control port of the DUC. In addition, each of the waveforms 118*a–c* produces zero DC offset voltage, since the total area of each signal below 0 volts is approximately equal to the total area of that signal above 0 volts. Therefore, each of the waveforms 118*a–c* produces zero DC current, thereby avoiding the problems associated with the DC current rating of semiconductor devices present at control port of the DUC. Furthermore, each of the waveforms 118*a–c* has a small voltage swing, which reduces the RF driver amplifier output power requirement and the amount of dissipated power in the DUC.

Figure 6:
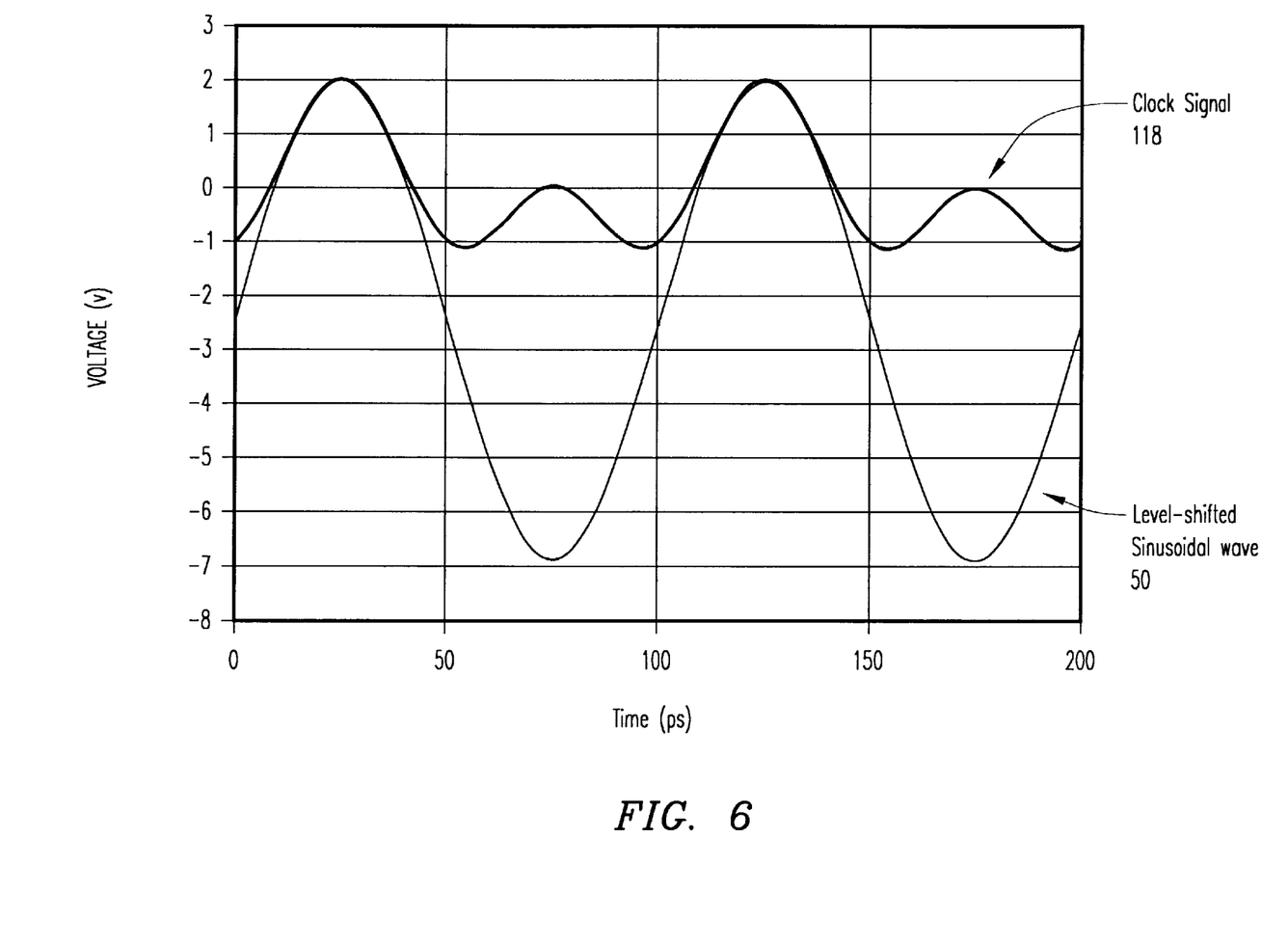
FIG. 6 is a graph comparing a 25% duty cycle waveform generated by the conventional level-shifting method and a 25% duty cycle waveform generated by the duty-cycle adjustable clock generator shown in FIG. 4.

FIG. 6 is a graph comparing a conventional 25% duty-cycle waveform 50 generated by the conventional level-shifting method and a new 25% duty-cycle waveform 118 of the type generated by the clock generator of FIG. 4. In FIG. 6, each signal 50 and 118 yields a 25% duty cycle clock at 10 GHz with a threshold voltage of 0.7 volts. As can be seen in FIG. 6, both waveforms 50 and 118 track each other when the voltage is greater than 0.7 volts (i.e., the DUC has the same "ON" response controlled by either the level-shifted sinusoidal waveform 50 or the new waveform 118). However, the level-shifted sinusoidal waveform 50 requires an 8.86 Vpp sinusoidal voltage swing with −2.43V DC offset to achieve the "OFF" condition. By contrast, the "OFF" condition is achieved by the new waveform 118 by combining a 2 Vpp 10 GHz sinusoidal waveform with a 2 Vpp 20 GHz sinusoidal waveform to produce a zero DC level. In addition, the maximum reverse bias voltage of the level-shifting sinusoidal waveform 50 is −6.86 V, as compared to −1.125 V for the new waveform 118. It should further be noted that, in a 50-ohm transmission line system, the input power in the clock lines is 23 dBm in order to generate the 8.86 Vpp waveform 50 of the level-shifted method, while only 13 dBm total to generate the new waveform 118.

Figure 7:
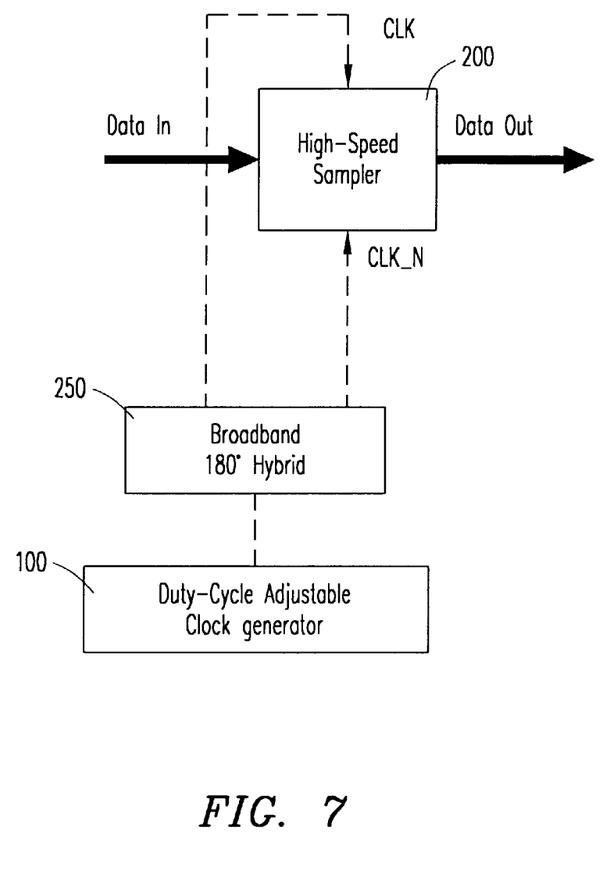
FIG. 7 is a block diagram illustrating an exemplary application of the duty-cycle adjustable clock generator of FIG. 4 in a high-speed sampler circuit.
Figure 8:
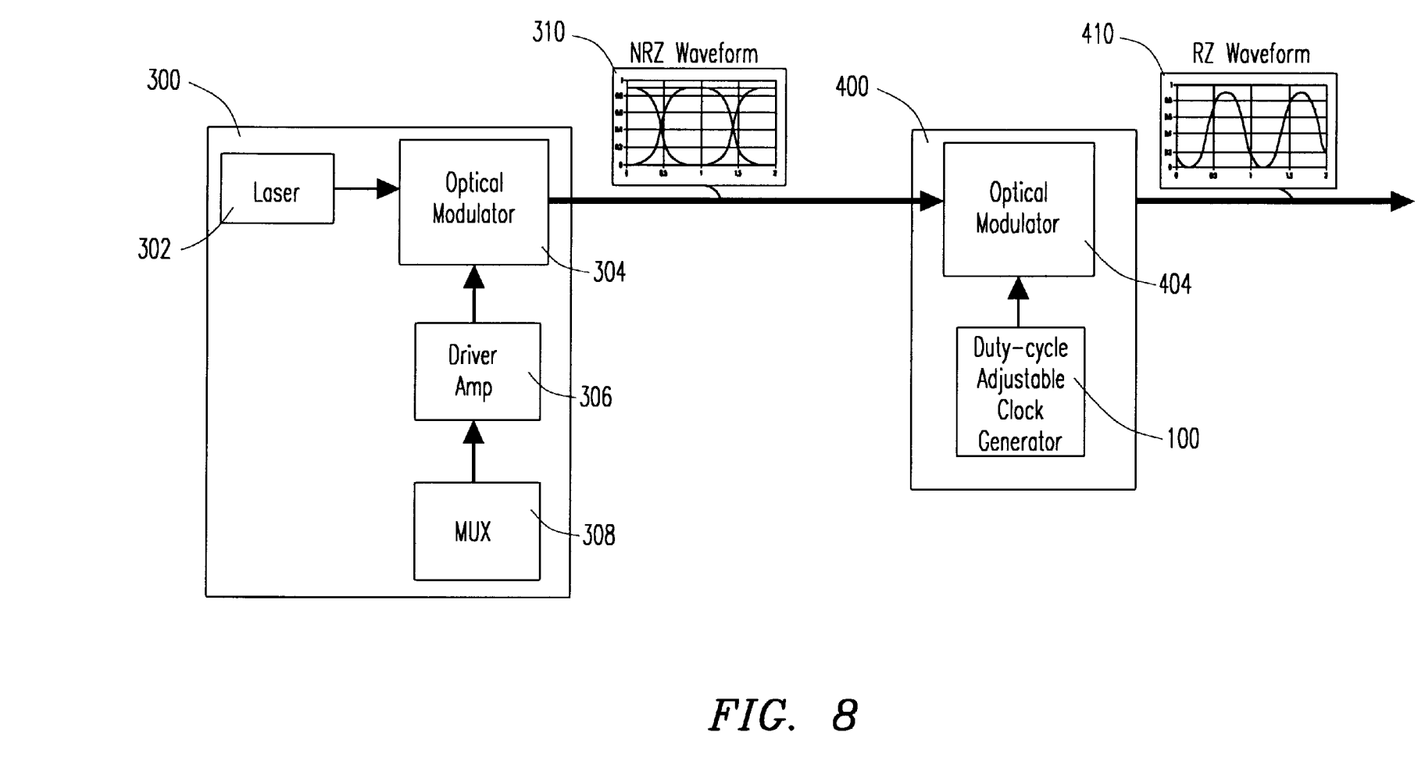
FIG. 8 is a simplified block diagram of a NRZ-to-RZ converter using the duty-cycle adjustable clock generator of FIG. 4.
Figure 9:
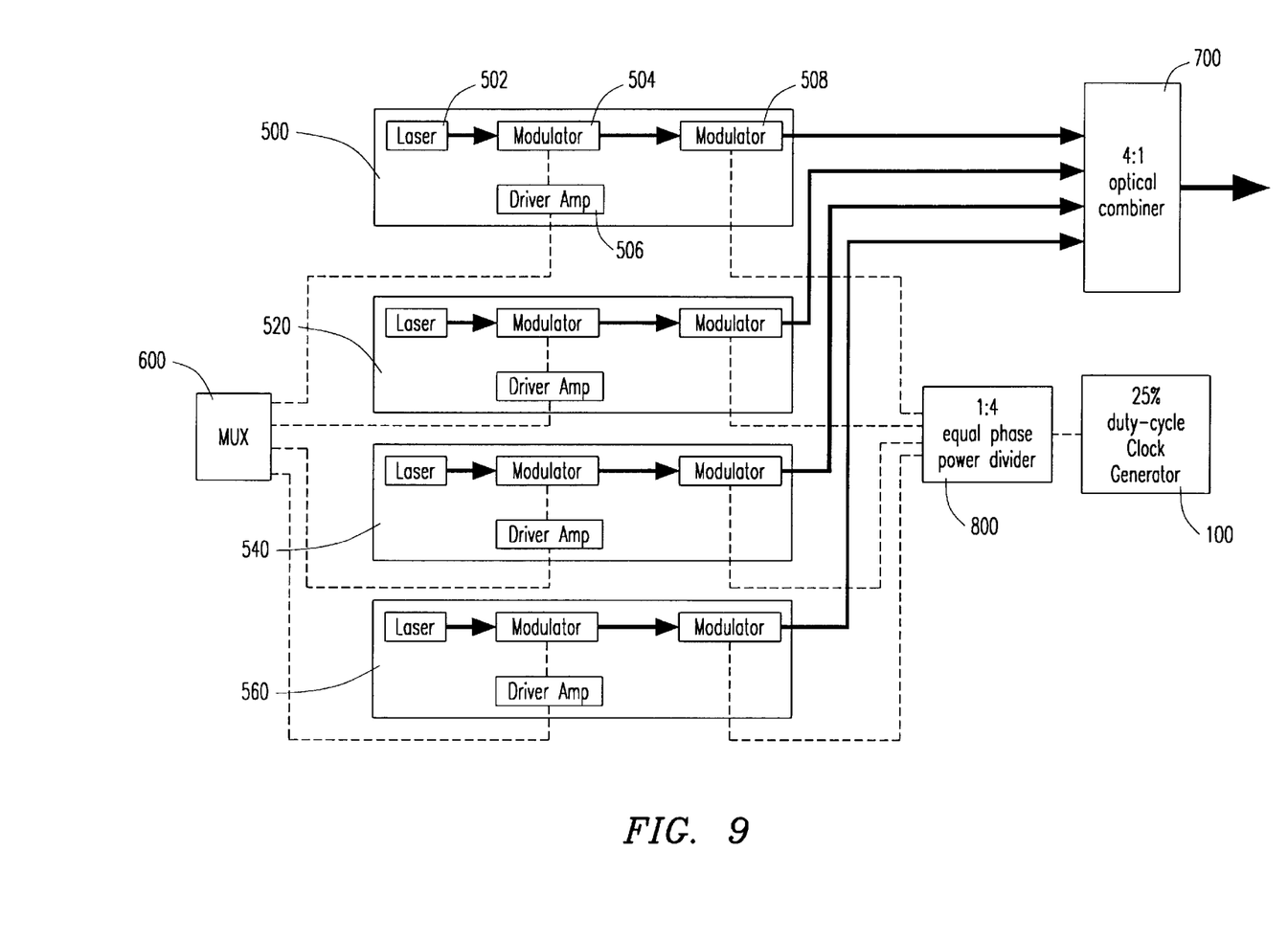
FIG. 9 is a simplified block diagram of a 4-to-1 OTDM system using NRZ to RZ converters with 25% duty-cycle clock produced by the clock generator of FIG. 4.

Referring now to FIGS. 7–9, various applications of the exemplary duty-cycle adjustable clock generator are illustrated. One example of a general clock application for high-speed circuits is shown in FIG. 7. In FIG. 7, a typical high-speed sampler 200 is depicted. The input data feeds into the high-speed sampler module 200 and propagates to the output port while the sampler circuit is turned on by the clock signal. The output signal is isolated from the input and maintains it's output value while the sampler circuit 200 is on "OFF" state. The clock signal is generated by the duty-cycle adjustable clock generator 100 and feeds into a broadband 180° hybrid circuit 250 to convert into differential signals.

It should be noted that the sampler circuit 200 can also be operated by a single-end control input; i.e., the clock signal only connects to CLK input and the CLK_N port is terminated by ground or a fixed DC bias voltage. In this case, the duty-cycle adjustable clock generator 100 feeds the high-speed sampler 200 directly. A high-speed sampler 200 can be realized by various devices, such as a high-speed flip-flop, diode bridge, etc. As mentioned previously, the duty-cycle adjustable clock signal has a zero DC level and low reverse bias swing. Thus, the clock signal can be used at the system integration level to adjust the sampling aperture in order to yield the best system performance without disturbing the DC bias condition, exceeding the maximum reverse bias condition or exceeding the maximum current rating.

An example of an optical transmitter and Non-Return-to-Zero (NRZ) to Return-to-Zero (RZ) converter 400 with adjustable duty-cycle control is shown in FIG. 8. The optical NRZ transmitter 300 includes various components, such as a laser source 302, optical modulator 304, modulator driver 306, MUX 308, etc. The NRZ-to-RZ converter 400 includes an optical modulator 404 and the duty-cycle adjustable clock generator 100. The duty-cycle of the modulated optical pulses is controlled by the clock waveform, which is generated by clock generator 100.

One implementation for using a sinusoidal waveform to modulate an optical modulator in order to convert an NRZ data stream 310 into an RZ data stream 410 is to increase the transmission distance in high-speed optical communication systems. The duty-cycle needed in such RZ systems to yield the best system performance is usually around 25–50%. Although an RZ signal 410 with duty-cycle of between 25–50% is shown in FIG. 8, it should be understood that an RZ signal 410 with duty-cycle less than 25% can be realized by cascading two NRZ-to-RZ converters 400.

The choice of the duty-cycle is balanced among the high extinction ratio, the self-phase modulation effect and the pulse broaden effect. An RZ pulse with shorter duty-cycle allows the system to deliver higher peak power, which produces a high extinction ratio. However, the higher the peak power is, the greater the self-modulation effect will be. Moreover, the shorter the pulse is, the wider the bandwidth will be. Thus, the system is more subject to pulse broadening by dispersion and results in a higher inter-symbol-interference power penalty.

In the optical system link, there are dispersion compensation circuits and other nonlinear components that are used to maximize the transmission distance and to optimize for the lowest bit-error-rate. The complexity of the optical system makes it difficult to have a pre-determined duty-cycle value on the NRZ-to-RZ converter 400 to achieve the optimum system operating point. Therefore, the ability to adjust the RZ pulse duty-cycle effectively at system integration level provided by the duty-cycle adjustable clock generator is advantageous.

As an extension of the NRZ-to-RZ converter 400 shown in FIG. 8, a 4-to-1 Optical-Time-Domain-Multiplexing (OTDM) system using NRZ-to-RZ converters 500, 520, 540 and 560 with 25% duty-cycle clock is depicted in FIG. 9. The OTDM system has several applications in the 40 Gbps industry. For example, the OTDM system can be used to convert a 4×10 parallel 40 Gbps system to a serial 40 Gbps system. This approach provides flexibility to system integrators to take reduce costs in a 4×10 Gbps parallel solution.

As shown in FIG. 9, a MUX 600 generates the 40 Gbps NRZ parallel signals. Each output of the MUX 600 transmits a respective 10 Gbps NRZ signal to an optical modulator 504 via a modulator driver 506, if necessary. Optical modulator 504 has optical input from optical laser 502 and NRZ data input from the modulator driver 506. The output of the optical modulator 504 sends out the NRZ optical modulated signal to the NRZ-to-RZ modulator 508. A 25% duty-cycle clock signal is generated by the duty-cycle adjustable clock generator 100. The 25% duty-cycle clock signal distributes to four NRZ-to-RZ modulators 508 via a 1:4 power divider 800 and the equal-phase distribution network in order to maintain good synchronization on the optical outputs of the four NRZ-to-RZ modulators 508.

Finally, the four synchronized optical 10 Gbps 25% duty-cycle RZ data streams from the converters 500, 520, 540, 560 are assigned proper time delay 0 ps, 25 ps, 50 ps and 75 ps, respectively, and are combined via a 4:1 optical combiner 700 to form a 40 Gbps NRZ data stream. Similarly, using two converters 500, 520 and with 0 ps and 50 ps delay, respectively, a 20 Gbps RZ data stream can be generated. The same method is applicable to other data rates, with minor adjustments to the respective time delays. In addition, the duty-cycle value can also be adjusted based on the system needs.

As will be recognized by those skilled in the art, the innovative concepts described in the present application can be modified and varied over a wide range of applications. Accordingly, the scope of patented subject matter should not be limited to any of the specific exemplary teachings discussed, but is instead defined by the following claims.

What is claimed is:

1. A clock generator, comprising:
   a first waveform generator for generating a first sinusoidal waveform having a desired clock frequency;
   a second waveform generator phase-locked to said first waveform generator for generating a second sinusoidal waveform having a frequency double that of said desired clock frequency; and
   a combiner for combining said first and second sinusoidal waveforms to produce a clock signal having said desired clock frequency.

2. The clock generator of claim 1, wherein said combiner is a passive power combiner.

3. The clock generator of claim 1, further comprising:
   at least one phase shifter operatively connected between said combiner and at least one of said first waveform generator and said second waveform generator to modify the phase relationship between said first and second sinusoidal waveforms.

4. The clock generator of claim 3, wherein said at least one phase shifter is a passive transmission line, an electrically tunable device or a mechanically tunable device.

5. The clock generator of claim 3, further comprising:
   at least one magnitude control device operatively connected between said combiner and at least one of said first waveform generator and said second waveform generator to modify the magnitude relationship between said first and second sinusoidal waveforms.

6. The clock generator of claim 5, wherein the magnitude relationship between said first and second sinusoidal waveforms determines the duty-cycle of said clock signal.

7. The clock generator of claim 5, wherein said at least one magnitude control device is a passive attenuator, an electrically tuneable attenuator device, a mechanically tunable attenuator device, a fixed gain amplifier, an electrically tunable gain amplifier or a mechanically controlled gain amplifier.

8. The clock generator of claim 5, wherein said at least one magnitude control device and said at least one phase shifter are included within at least one of said first and second waveform generators.

9. The clock generator of claim 5, wherein said at least one magnitude control device and said at least one magnitude control device are included within a single device.

10. The clock generator of claim 5, wherein said at least one magnitude control device and said at least one phase shifter are pre-distortion circuits capable of compensating for frequency response deviations of said first and second sinusoidal waveforms through a clock distribution network.

11. The clock generator of claim 1, wherein said first waveform generator is realized by a first source and said second waveform generator is realized by a second source with common phase-lock.

12. The clock generator of claim 1, wherein said first waveform generator and said second waveform generator are realized by a single source and frequency multiplier.

13. The clock generator of claim 1, wherein said first waveform generator and said second waveform generator are realized by a single source having two harmonics.

14. The clock generator of claim 1, wherein said desired clock frequency is at least in the microwave frequency range.

15. The clock generator of claim 1, wherein said clock signal has a negative voltage swing less than −2 volts.

16. The clock generator of claim 1, wherein said clock signal has a zero DC offset voltage.

17. The clock generator of claim 1, wherein said clock signal has a voltage swing of less than 4 volts.

18. An arrangement for sampling data with an adjustable sampling aperture, comprising:
    a sampler connected to receive input data and sample said input data to produce output data; and
    a clock circuit having a first waveform generator for generating a first sinusoidal waveform having a desired clock frequency, a second waveform generator phase-locked to said first waveform generator for generating a second sinusoidal waveform having a frequency double that of said desired clock frequency and a combiner for combining said first and second sinusoidal waveforms to produce a clock signal having said desired clock frequency;
    wherein said clock signal controls the sampling aperture of said sampler.

19. An NRZ-to-RZ converter with adjustable duty-cycle control, comprising:
    an optical modulator connected to receive an NRZ modulated waveform and output an RZ modulated waveform; and
    a clock circuit having a first waveform generator for generating a first sinusoidal waveform having a desired clock frequency, a second waveform generator phase-locked to said first waveform generator for generating a second sinusoidal waveform having a frequency double that of said desired clock frequency and a combiner for combining said first and second sinusoidal waveforms to produce a clock signal having said desired clock frequency;
    wherein the output of said clock circuit is connected to the electrical input of said optical modulator;
    wherein the duty-cycle of the RZ modulated signal output from said optical modulator is controllable via the duty-cycle of said clock circuit.

20. The converter of claim 19, further comprising at least one additional clock circuit cascaded with said clock circuit to produce said RZ modulated signal with a duty-cycle less than 25%.

21. An optical-time-domain-multiplexing system, comprising:

at least two NRZ-to-RZ optical modulators, each being connected to receive a respective NRZ optical modulated signal modulated using the same NRZ data input and convert said respective NRZ optical modulated signal to a respective RZ or NRZ optical modulated signal with a specific duty-cycle;

an optical combiner connected to receive each said respective RZ or NRZ optical modulated signal and optically couple said received RZ or NRZ optical modulated signals into an output optical data stream; and     a clock circuit having a first waveform generator for generating a first sinusoidal waveform having a desired clock frequency, a second waveform generator phase-locked to said first waveform generator for generating a second sinusoidal waveform having a frequency double that of said desired clock frequency and a combiner for combining said first and second sinusoidal waveforms to produce a clock signal having said desired clock frequency, said clock signal controlling said at least two NRZ-toRZ optical modulators;

wherein the duty-cycle of said at least two NRZ-to-RZ optical modulators is controlled by the duty-cycle of said clock signal.

22. A method for generating a clock signal having a desired clock frequency, comprising:

generating a first sinusoidal waveform having the desired clock frequency;

generating a phase-locked second sinusoidal waveform having a frequency double that of said desired clock frequency; and     combining said first and second sinusoidal waveforms to produce said clock signal having the desired clock frequency.

23. The method of claim 22, further comprising:

modifying the phase relationship between said first and second sinusoidal waveforms.

24. The method of claim 23, further comprising:

modifying the magnitude relationship between said first and second sinusoidal waveforms.

25. The method of claim 24, further comprising:

determining the duty-cycle of said clock signal using the magnitude relationship between said first and second sinusoidal waveforms.

26. The method of claim 24, wherein said steps of modifying the phase relationship and the magnitude relationship further comprise:

compensating for frequency response deviations of said first and second sinusoidal waveforms through a clock distribution network using the magnitude relationship and the phase relationship.

27. The method of claim 22, wherein the desired clock frequency is at least in the microwave frequency range.

28. The method of claim 22, wherein said clock signal has a negative voltage swing less than −2 volts.

29. The method of claim 22, wherein said clock signal has a zero DC offset voltage.

30. The method of claim 22, wherein said clock signal has a voltage swing of less than 4 volts.

* * * * *